United States Patent [19]

Shea et al.

[11] 4,247,594
[45] Jan. 27, 1981

[54] ELECTRICALLY CONDUCTIVE RESINOUS COMPOSITION

[75] Inventors: Madilyn R. Shea, Lowell, Mass.; Earl A. Pike, Salem, N.H.

[73] Assignee: Marshall & Pike Enterprises Inc., Salem, N.H.

[21] Appl. No.: 34,374

[22] Filed: Apr. 30, 1979

[51] Int. Cl.³ .................. B23P 1/04; C25F 1/00; B32B 15/08

[52] U.S. Cl. .................. 428/328; 29/746; 134/2; 134/28; 204/129.35; 204/129.43; 204/141.5; 204/144.5; 252/503; 252/511; 252/512; 260/37 EP; 260/37 M; 427/58; 428/379; 428/389; 428/407; 428/418

[58] Field of Search ........... 428/416, 418, 407, 328, 428/389, 379; 427/58; 29/746; 134/2, 26, 28; 252/511, 512, 503, 518; 260/37 EP, 37 M; 204/131, 129.35, 129.43, 140, 141.5, 144.5

[56] References Cited

U.S. PATENT DOCUMENTS

| | | | |
|---|---|---|---|
| 2,564,823 | 8/1951 | Wallace | 204/129.25 X |
| 2,682,483 | 6/1954 | Erbe | 428/457 |
| 3,202,596 | 8/1965 | Canevari | 428/416 X |
| 3,278,455 | 10/1966 | Feather | 428/418 X |
| 3,403,084 | 9/1968 | Andrews | 204/129.25 |
| 3,412,043 | 11/1968 | Gilliland | 260/37 EP |
| 3,983,075 | 9/1976 | Marshall et al. | 260/37 EP |
| 4,066,625 | 1/1978 | Bolger | 260/37 EP |
| 4,169,187 | 9/1979 | Glazar | 428/418 |
| 4,197,351 | 4/1980 | Rolles et al. | 260/37 M |

*Primary Examiner*—Harold Ansher
*Attorney, Agent, or Firm*—Lowell H. McCarter

[57] ABSTRACT

An electrically conductive resinous composition is prepared by cleaning the surface of copper flakes, mixing from about 25 to 75 percent by weight copper flakes with a resinous composition containing a curative selected from the group consisting of a dicyandiamide, a boron trifluoride releasing complex, a boron trichloride releasing complex or mixtures thereof, curing a layer of the resinous composition on an insulated substrate whereby a nonconductive layer is prepared and momentarily applying a voltage to the nonconductive resinous layer whereby the resinous layer becomes conductive. The one component resinous composition comprises from about 25 to about 70 percent by weight copper flakes with the balance of the compositions consisting of a resinous binder with from 1 to about 10 parts per hundred parts resinous binder of a curative selected from dicyandiamide, a boron trifluoride releasing complex, a boron trichloride complex and mixtures thereof.

10 Claims, No Drawings

ELECTRICALLY CONDUCTIVE RESINOUS COMPOSITION

This invention is an improvement over the composition and method claimed in U.S. Pat. No. 3,983,075 and relates to an electrically conductive, cured epoxy resin filled with from 25 to 70 weight percent copper flakes. The copper flakes are prepared in a manner whereby the electrical characteristics of the epoxy resin composition and the flakes do not change when they are used over a prolonged period of time. More particularly, this invention relates to an epoxy resin filled with copper flakes and cured with a curing agent which avoids the oxidation of the copper flakes in the epoxy resin matrix. The use of the copper flake filled resin in its cured state such as for purposes of radiant heating is within the scope of the invention. Still further, this invention relates to a method of treating the copper flake particulate for incorporation into the epoxy resin and the curing of the resin to avoid the undesirable properties. As another aspect of this invention, a mixture of copper flake with carbon black for avoiding the local short circuiting at higher voltages has been indicated in the combination above.

BRIEF DESCRIPTION OF THE PRIOR ART

It has been a fairly long sought goal to provide an electrically conductive resinous composition having substantially invarient properties and using readily available materials to achieve the desired purpose. In the past, resinous compositions which would have been made conductive by inclusion of conductive particulates, have fallen into groups based on the ultimate performance of the resinous composition.

Carbon filled resinous compositions whereby carbon of various types and quantities as well as sizes has been employed to provide the desired electrical conductivity. In U.S. Pat. No. 2,682,483, the various resistance characteristics of materials, especially the carbon based materials, are listed. Of the carbon materials, graphite and carbon black have been used in a collodial form together with a collodial metal such as gold, silver, and aluminum.

The second approach for obtaining conductive resinous compositions has consisted in using silver or gold in its flake form in a resinous binder, sometimes in conjunction with an inert filler. The prior art with respect to this approach has been outlined in U.S. Pat. No. 3,412,043. It can well be appreciated that silver and/or gold has become a very expensive material for incorporation in conductive resin compositions. Although it has been mentioned that in the past lower costs are achieved by conductive elemental copper power having an electrolytically deposited coating of silver as a conductive ingredient, this combination has not been employed because of corrosiveness of copper and attendant conductivity decay.

It has been disclosed in U.S. Pat. No. 3,412,043, that silver flake requires the use of a resinous binder and that the primary consideration for the conductivity is the silver to resin ratio. A secondary consideration is the particle size or type of the filler. It has been found that the teachings concerning silver cannot be readily transferred to copper flake because of relative noninertness of copper, vis-a-vis, silver. Still further, in U.S. Pat. No. 3,278,455, a copper filled epoxy composition as a conductive material has been disclosed. Although the fully cured resin is made using a primary amine as a curative for the epoxy resin the use of the excessive amount of curing agents as well as the effectiveness of the curing agent as the oxidant for copper flake has rendered the disclosed combination unacceptable, especially for long duration application and use of the material for the purposes illustrated herein.

U.S. Pat. No. 3,983,075, as developed in 1974, resulted in partial solution to provide an acceptable conductive resin. However the expense of using large volumes of solvents and solutions for cleaning the copper flake results in a costly product. The product using polyamide curatives has a short shelf life because of the copper-amide interaction. Elevated temperatures cures to shorten the cure time in this system result in impared conductivies.

BRIEF DESCRIPTION OF THE INVENTION

In preparing electrically conductive compositions of epoxy resin and copper flake, the combination of the conductive material with the resin depends on certain critical elements. These elements must be taken into consideration before an acceptable electrically conductive resinous composition can be achieved using readily available and less expensive materials and where the performance of the electrically conductive composition is substantially unvaried over a prolonged period of use.

Thus it has been found that the processing time for preparation of copper flake filled conductive resinous compositions can be shortened by a factor of six. The volume of solvents and acid treating solutions can be reduced by a factor of six and five, respectively. The copper flake cleaned according to the process described herein may be stored in a vacuum retaining container longer than a month before any of the conductive properties show signs of deterioration. With the use of curing agents used herein it is no longer necessary to effect the curing immediately after mixing the ingredients together. After combining the ingredients, i.e., the resinous binder, the curing agent and the copper flakes, the mixture can be stored for more than one year with no apparent loss in conductivity characteristics. Previously reported high-temperature curing copper flake containing resins were nonconductive after curing. Following the procedure described herein such copper flake filled high temperature cure resins can be made conductive.

DETAILED DESCRIPTION OF THE INVENTION

It had been expected that copper filled conductive epoxies would be generally available because of significant cost advantage over silver filled materials. However, the reverse has been true. One of the major reasons for the unavailability of copper filled conductive epoxies suitable for the intended purpose is that copper readily oxidizes and thus highly conductive copper filled resins cannot readily be made.

It has been found that not only the material employed is important, but that copper flake rather than copper powder must be used. The flake gives less surface area per unit of volume and thus improved particle to particle contact is established. Contrary to the teaching concerning silver flake in the prior art such as in the U.S. Pat. No. 3,412,043, copper flake cannot tolerate the presence of undesirable surface coatings, such as existing oxides formed by corrosion and organic matter deposited on the flake as a result of the manufacturing process.

PREPARATION OF COPPER FLAKE

It has been found that in order to produce conductive copper epoxy resin compositions, careful cleaning of the copper flake is essential. Thus, the cleaning requires that copper flake is subjected to a cleaning action by a proper agent. The cleaning removes any surface deposits on the copper flake. It has been found that Belmont's Smelting and Refining Company's No. 250 copper flake, a 250 mesh approximately 58 microns particle size, with a purity of at least 99.0% copper, must be carefully prepared for obtaining the desirable characteristics. Copper flakes having a particle size of 10 to 200 microns are suitable. A quantity of the copper flake thus described is mixed with a solvent using a maximum of two volumes of the solvent are used per volume of flakes. Higher ratios can be used but contrary to that reported in U.S. Pat. No. 3,983,075 are not needed if 1,1,1-trichloroethane is used as the solvent. Suitable solvents include chlorinated alkanes or chlorinated alkenes of 1 to 3 carbon atoms, ethers, ketones, benzene or toluene. Preferred solvents are trichloroethane or perchloroethane.

The solvent copper flake mixture is stirred for about one half-hour and then filtered. After filtering, the solvent washed flakes are rinsed several times with rinsing solvent. Suitable rinsing solvents include denatured alcohol, methyl alcohol, ethyl alcohol, isopropyl alcohol, acetone, methyl ethyl ketone or mixtures thereof, or similar water miscible solvents. The copper flakes, while still damp with the rinsing solvent, are mixed with a maximum of about two volumes of 20% citric acid per volume of flakes and stirred continuously for about one hour. The 20% citric acid-copper flake mixture is then filtered and rinsed thoroughly with distilled water until the rinse solution runs clear. The flakes are then rinsed with a rinsing solvent such as denatured alcohol and filtered to remove the excess fluid. Drying of the damp copper flakes is carried out in a vacuum oven generally at a temperature of about 100° F. After drying, the flakes are dry and powdery. It is important that the cleaned and dry copper flakes are stored in a vacuum or under an inert gas until ready for use. Preferably the copper flakes are stored in a vacuum retaining container because of the tendency of copper to oxidize readily.

It was found in U.S. Pat. No. 3,983,075 that if the copper flakes were mixed with the resin but not cured promptly that degradation of the flakes occurred. Thus, panels made and cured the same day had an average volume resistivity of 0.013 ohm-cm. Panels cured the next day from the same batch of copper filled epoxy resin had a volume resistivity of 0.060 ohm-cm; and a panel from the same batch of resin cured three days after preparation had a volume resistivity of 1.00 ohm-cm. Thus with the prior art copper flake filled epoxy resins it was important that not only the copper flakes are used immediately, but that curing also be effected immediately.

In contrast to the prior art, the compositions of this invention will have a shelf life of a year or more. This is accomplished by removing the air mixed into the resin flake mixture during processing. The deaerated copper flake filled resin may than be stored in a tightly closed container. Thus the curing need not take place until convenient.

The purity of the copper flakes affects the conductivity of the resins. Reproducibility of the result is also affected by purity of the copper flakes. Thus, a batch of copper flakes, which were cleaned according to U.S. Pat. No. 3,983,075 had an average impurity level of 7,650 ppm (parts per million) when used (30 weight percent copper flakes) in an epoxy resin on a panel, had a volume resistivity of 0.327 ohm-cm, whereas, when the same resin was filled with the same amount of copper flakes, which had a purity of 1,270 ppm, a panel with the purer flakes had a volume resistivity of 0.158 ohm-cm.

Although the exact reason is not known and the Applicants do not wish to be bound by a postulation, it appears that the lower inherent conductivity (higher resistivity) could be attributable to some form of nonconductive oxide coating formation on the surface of the copper flakes in the environment in which it is being used, e.g. epoxy resins, (originating in part from the impurities). It is likely that the detrimental contribution from the impurities is enhanced.

The surfaces of the copper flakes may be coated with a layer of stearic acid or some equivalent during the production process, such as by ball milling. It is necessary, contrary to what the prior art has said about silver flake, that this coating be removed by using a suitable solvent.

Useful solvents are ethers, such a dimethyl ether or diethyl ether; haloalkylene or haloalkylane solvents having from 1 to 3 carbon atoms such as the chloroalkanes and trichloroethane which is preferred. Other solvents that can be used include ketones, such as acetone and methyl ethyl ketone, and aromatics such as benzene and toluene.

Again, as mentioned above, it is necessary that the flakes be treated in an acid solution such as citric acid. Other acids suitable for the purpose are dilute nitric acid (about 5% by weight), aliphatic carboxylic acid having from 1 to 4 carboxylic groups and from 0 to 4 hydroxy groups and ranging from 3 carbon atoms (tartaric acid and tricarballylic acid) and up and, in general, an aliphatic acid of at least 2 carboxylic groups.

The concentration of the acid in the solvent should be from 0.1 molar to a saturated solution. The higher concentrations however are probably wasteful. When clean flakes prepared by the method described above have been left exposed to air for a few days they rapidly oxidize. If the oxidized copper flakes are then incorporated into the epoxy resin matrix the result is a non-conductive composition.

COPPER FLAKE CONTENT IN THE RESIN

As expected, the conductivity of a suitable test panel increases with increased copper flake content. (In context of prior art designation, the term "copper flake" and "copper flakes" are used as synonyms.) However, there is a minimum loading value of about 25 weight percent copper flake. Below about 25 weight percent copper flake in the resin, a sharp drop in conductivity occurs.

It appears that the particle-to-particle contact ceases to exist at some point when less than about 25 percent by weight of copper flake is used per unit weight of resin. Thus, volume resistivity varied by the methods employed herein from as low as 0.0015 ohm-cm to an essentially nonconductive material at less than 20 weight percent copper flakes. The high loading compositions are generally in the vicinity 60 percent by weight copper flakes. However, viscosity and handling problems essentially confine the copper flake loading to 60 percent by weight and less.

To improve the total combination, when volume resistivities greater than that obtained with copper loadings of less than 50% are desired a 5 to 10 percent by weight of a conductive carbon black can be added to the resin mixture. A typical carbon black is Cabot Corporation's carbon black designated as XC-72. This type of carbon black consists of particles about 30 millimicrons in diameter which line together to form chains. It has the lowest density of Cabot Corporation's carbon blacks and the highest surface area (about 6 lbs. per cu. ft. and 254 sq. meters per grams, respectively). Still further, carbon black in the resin has a side benefit of masking the copper color when desired. In addition, the smaller carbon black particles appear to fill the interstitial space between the copper flakes and thus assure better contact and hence conductivity.

EPOXY RESINS AND CURATIVES THEREFORE

As suitable epoxy resins, the bisphenol A based epoxy resins, i.e., the EPON series are available from Shell Chemical Co. The Araldite series of resins are available from Ciba-Geigy Corporation. For purposes of easy workability, tractable resins are preferred. Resins which can be readily rendered tractable by heating or which can tolerate dilution, can also be employed. However, any additional steps, in the procedure of mixing a less tractable resin with the copper flakes render the dispersion problem mentioned above more acute and hence, the tractable resins are suggested as the preferred embodiment. A tractable resin is defined as a resin which is a liquid at room temperature.

Epoxy resins of the bisphenol A-epichlorohydrin or epoxy novolac or cycloaliphatic types may be used. These are fully described in the available literature and can be readily purchased.

Curing agents or curatives preferred within the scope of this invention are those activated by heating above about 200° F. and include dicyandiamide, boron trifluoride-amine complexes, trichloride-amine complexes and mixtures thereof. Boron trifluoride-amine complexes include boron trifluoride complexed with monoethylamine, trimethylamine, benzyldimethylamine, octyldimethylamine, piperidine, pyridine, diethylaniline, phenylamine diphenylamine, phenyldiethylamine, phenyl toluenenamine, phenylacetylamine, tolueneamine, phenylenediamine, and ethylamine-furfural. Similar boron trichloride complexes can also be used within the scope of this invention.

Boron trichloride tertiary amine complexes can also be used within the scope of this invention. These complexes may have the general formula $BCl_3 \cdot NR_1R_2R_3$ wherein $R_1$, $R_2$ and $R_3$ denote like or different aliphatic, aromatic, heterocylic or aryl-aliphatic radicals and wherein $R_1$, $R_2$ and $R_3$ belong, jointly or in pairs to heterocylic rings. The preferred boron trichloride tertiary amine complexes are boron trichloride-benzyldimethylamine, boron trichloride-pyridine complex boron trichlorideoctyldimethylamine complex and borontrichloride-trimethylamine complex.

One of the preferred curing agents (boron trifluoride-amine complexes) is boron trifluoride monoethylamine. Its working temperature ranges from about 200° to about 400° F. with the optimum being between about 250° and 300° F. Useful working concentration range is from 1 to 10 phr (parts per hundred resin) with the optimum being 3 phr.

Another preferred curing agent is a Ciba Geigy Corporation boron trichloride-amine complex known as XU 213. XU 213 can be used in the temperature range of about 100° to 400° F., preferably 300° to 350° F. Working concentration from 1 to 10 phr, preferably 2 to 4 phr are to be used. XU 213 comes in the liquid form and therefore is relatively easy to work with and can be uniformly distributed throughout the resin-copper mixture.

Another preferred curing agent is dicyandiamide. It is a solid at room temperature and added to the liquid epoxy in the range between 1 and 10 phr, preferably 3 to 5 phr. Dicyandiamide has a working temperature range of about 300° to 400° F., preferably 320° to 350° F. The dicyandiamide curing agent is somewhat more difficult to uniformly distribute throughout the resin copper mixture since it is a solid at ambient temperatures. However, it does have excellent high temperature properties and good adhesion properties.

When the resin is to be cured the latent or inactive curing agent is thermally changed by heating into one or two active components which react with the epoxy to cure it. When the high temperature cure, i.e., above about 200° F., takes place using the treated copper flake filled epoxy, the cured resin is non-conductive or has very low conductivity when measured with conventional equipment and therefore unsuitable for most applications. However, the compositions are rendered conductive by attaching first and second leads from an electrical power supply to remote edges of the cured non-conductive composition and applying a momentary electrical potential of between about 3 and 110 volts, preferably between 10 and 40 volts. It is believed that the sudden voltage breaks down any resistance layers (formed by impurities or oxides) on the surface of the copper flake particles.

The quantity of the preferred curing agents used is from about 1 part up to about 50 parts per 100 parts epoxy resin, preferably 1 to 10 parts.

The following examples illustrate the preferred embodiments of the invention. In each example a quantity of copper flakes as received were stirred with 2 volumes of trichloroethane solvent for about 1 hour. The solvent was removed and the copper flakes rinsed several times with denatured alcohol. The copper flakes were then mixed with about two volumes of aqueous 20% citric acid and stirred for about one hour. After removing the aqueous citric acid the flakes are again rinsed with denatured alcohol. The damp copper flakes were then dried in a vacuum oven at less than about 100° F. The copper flakes were dry and powdery. The cleaned and dry copper flakes were stored under vacuum until ready for use.

To incorporate the cleaned and dried copper flakes into the resinous binder the following procedure was followed. The selected amount of epoxy resin and curing agent were placed in mixing vessels equipped with a paddle blade stirrer. The stirrer was started and small increments of the copper flake fed into the vessel at intervals. The stirring was continued until the copper flakes were properly dispersed throughout the resin.

In the mixing process substantial quantities of air were entrapped in the composition. Therefore, if the one-component composition is to be stored for any length of time, the entrapped air should be removed. This can be accomplished by putting the one-component composition in its storage container. The storage container is then placed in a vacuum oven at room temperature and a vacuum drawn for several hours until entrapped air is removed. The storage container is then securely capped.

Examples 1 through 4 below were prepared and the compositions cured on an insulating substrate at temperatures and for the times indicated. EPON 828, Araldite 507, and Araldite 6004 are trade names for bisphenol A based epoxy resins. Two metal foil connections were made on each example at remote locations. The compositions of examples 1, 2 and 4 as cured were essentially non-conductive. Examples 1, 2 and 4 were made conductive by applying a momentary voltage across the metal foil connections embedded in the cured composition. The conductivity of Example 3 was substantially improved by a momentary voltage across the embedded metal foil connections.

| Example | Ingredients | Wt. % | Parts by Weight | Cure | Voltage to make Conductive |
|---|---|---|---|---|---|
| (1) | EPON 828 | 6.2 | 14 | | 15 |
| | ARALDITE 507 | 37.9 | 86 | 2 hrs. at 350° F. | |
| | Cu flake | 52.8 | 120 | | |
| | Dicyandiamide | 3.1 | 7 | | |
| (2) | ARALDITE 507 | 42.9 | 100 | | 12 |
| | Boron trifluoride monoethylamine | 1.3 | 3 | 2 hrs. at 320° F. | |
| | Cu flake | 55.8 | 130 | | |
| (3) | ARALDITE 6004 | 43.3 | 100 | 2 hrs at 320° F. | Is conductive as cured but conductivity improves by a factor of 10 if subjected to a momentary jolt of 12 volts. |
| | *XU 213 | 1.3 | 3 | | |
| | Cu flake | 55.4 | 128 | | |
| (4) | ARALDITE 507 | 39.3 | 100 | 2 hrs. at 310° F. | 6 |
| | **ANCHOR 1222 | 4.9 | 12.5 | | |
| | Cu Flake | 55.8 | 142 | | |

*A boron trichloride-amine complex sold by Ciba-Geigy Corporation. It is yellowish brown with a melting point of 28° C. and a viscosity of about 70cp at 30° C.
**A boron trifluoride-amine complex sold by Pacific Anchor Chemical.

In addition to the above uses, the presently disclosed conductive resins lend themselves to numerous uses because the resin can be conformed to almost any shape. Consequently, these resins find uses in heating elements suitable for chemical tanks or certain instruments which need to be kept at a constant temperature.

The compositions are also ideal for defogging and deicing and snow melting applications. Inasmuch as the temperature which is needed for these purposes is low, the life of the conductive epoxy composition should be correspondingly long, hence, this use suggests itself very rapidly. The epoxy composite itself (especially if overcoated) is immune to most chemicals and is capable of withstanding severely corrosive conditions. Other uses for the conductive resin are for warming trays, high and low frequency shielding (including radio and microwaves) antistatic coatings, and constant temperature devices for instrument components.

What we claim is:

1. A composite comprising an insulating substrate base, and a layer of electrically conductive cured resinous composition on said base, said composition consisting essentially of an admixture of 25 to 70 weight percent, based on total resinous composition, copper flakes evenly distributed in a matrix of 100 parts epoxy resin containing from about 1 to 10 parts of a curing agent selected from the group consisting of dicyandiamide, a boron trifluoride-amine complex, a boron trichloride-amine complex, and mixtures thereof, wherein said resinous composition has been subjected to a momentary electrical potential between about 3 and 110 volts before becoming electrically conductive.

2. A method of preparing an electrically conductive resin composition on a substrate comprising the steps of admixing from about 25 to 70 percent by weight based upon resin composition of copper flakes with 100 parts epoxy resin and from about 1 to 10 parts of a curing agent, layering the admixture on an insulating substrate, curing the resin composition at a temperature above about 300° F. producing a non-conductive cured resin composition on the substrate, the improvement wherein the non-conductive cured resin composition on the substrate is subjected to a momentary electrical potential between about 3 and about 110 volts whereby an electrically conductive composition on an insulating substrate results.

3. The method of claim 2 wherein the curing agent is selected from the group consisting of dicyandiamide, boron trifluoride-amine complex, boron trichloride-amine complex and mixtures thereof.

4. A method of preparing an electrically conductive cured resinous composition comprising the steps of admixing from about 1 to about 10 parts of a curing agent selected from the group consisting of dicyandiamide, a boron trifluoride-amine complex, a boron trichloride-amine complex and mixtures thereof, with 100 parts of epoxy resin and 25 to 70 weight percent based on resin and curing agent of copper flake, layering the admixture on an insulating substrate, heating to a temperature between about 200° and 400° F. to cure the resin on the substrate whereby a non-conductive cured resin composition is prepared, subjecting the non-conductive cured resin to a momentary electrical potential between about 3 and about 110 volts whereby the non-conductive cured resinous composition becomes conductive.

5. A method of preparing electrically conductive copper flake filled epoxy resinous compositions comprising the steps of
(a) washing copper flakes having a particle size of from about 10 to 200 microns with at least one solvent selected from the group consisting of trichloroethane, perchloroethane, chlorinated alkanes or chlorinated alkenes of 1 to 3 carbon atoms, ethers, ketones, benzene or toluene, (b) rinsing said washed copper flakes with a rinsing solvent selected from the group consisting of denatured alcohol, methyl alcohol, ethyl alcohol, isopropyl alcohol, acetone, methylethyl ketone, and mixtures thereof, (c) washing said rinsed copper flakes with an aliphatic acid having at least 2 carboxylic groups or dilute nitric acid;

(d) rinsing the acid treated copper flakes with said rinsing solvent, (e) drying said copper flake, (f) admixing said copper flake with an epoxy resin and curative therefor, said copper flake being 70 percent to 25 percent by weight of said composition, (g) curing said epoxy resin-flake composition on a substrate whereby a non-conductive composite results; the improvement comprising the additional steps of (h) attaching a first lead from an electrical power supply to one edge of said non-conductive composite;

(i) adjusting the power supply to an electrical potential between about 3 and 110 volts;

(j) attaching a second lead from the electrical power supply to said non-conductive composite remote from the first lead; and (k) applying an instantaneous electrical potential between the first and second leads whereby the non-conductive composite becomes electrically conductive.

6. The method of claim 5 wherein the curative is selected from the group consisting of dicyandiamide, a boron trifluoride-amine complex, a boron trichloride-amine complex and mixtures thereof.

7. The method of claim 5 wherein the curative is boron trifluoride monoethylamine.

8. The method of claim 5 whereby an amount of carbon black from about 5 percent to 10 percent based on weight of the copper flake-epoxy composite is incorporated therein.

9. The method of claim 5 and wherein the aliphatic acid is citric acid.

10. The method of claim 5 and wherein the aliphatic acid is a dicarboxylic acid having at least one hydroxy moiety.

* * * * *